US008174918B2

(12) United States Patent
Hess

(10) Patent No.: US 8,174,918 B2
(45) Date of Patent: May 8, 2012

(54) PASSGATE FOR DYNAMIC CIRCUITRY

(75) Inventor: Greg M. Hess, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/888,748

(22) Filed: Sep. 23, 2010

(65) Prior Publication Data

US 2012/0075945 A1     Mar. 29, 2012

(51) Int. Cl.
*G11C 7/00*     (2006.01)
(52) U.S. Cl. ..................... 365/203; 365/205
(58) Field of Classification Search .......... 365/203, 365/205
See application file for complete search history.

(56) References Cited

U.S. PATENT DOCUMENTS

| 4,817,057 A * | 3/1989 | Kondo et al. ............... 365/203 |
| 5,265,058 A * | 11/1993 | Yamauchi ................... 365/203 |
| 7,304,895 B2 * | 12/2007 | Joshi et al. .............. 365/189.011 |
| 7,379,371 B2 * | 5/2008 | Im et al. ..................... 365/222 |
| 7,672,182 B2 | 3/2010 | Park et al. |
| 2004/0257895 A1 * | 12/2004 | Lee ........................... 365/203 |
| 2009/0219767 A1 | 9/2009 | Lines et al. |
| 2009/0238019 A1 * | 9/2009 | Kim ........................... 365/203 |
| 2009/0303820 A1 | 12/2009 | Arsovski et al. |
| 2009/0303821 A1 | 12/2009 | Arsovski et al. |
| 2010/0103755 A1 | 4/2010 | Chen et al. |

* cited by examiner

*Primary Examiner* — Michael Tran
(74) *Attorney, Agent, or Firm* — Lawrence J. Merkel; Meyertons, Hood, Kivlin, Kowert & Goetzel, P.C.; Erik A. Heter

(57) ABSTRACT

A dynamic circuit utilizing a passgate on a bit line is disclosed. In one embodiment, a precharge circuit is coupled to a first bit line, while a discharge circuit is coupled to a second bit line. A passgate transistor is coupled between the first bit line and the second bit line. A gate terminal of the passgate transistor may be hardwired or otherwise held to a static voltage such that it remains active when the circuit is operating. During a precharge phase, the precharge circuit may precharge the first bit line to a voltage that is at or near a supply voltage of the circuit. The second bit line may be precharged, through the passgate transistor, responsive to the precharging of the first bit line. The second bit line may be precharged to a voltage that is at least a threshold voltage less than the supply voltage.

19 Claims, 8 Drawing Sheets

PASSGATE FOR DYNAMIC CIRCUITRY

BACKGROUND

1. Field of the Invention

This invention relates to electronic circuits, and more particularly, to dynamic logic circuits.

2. Description of the Related Art

Dynamic logic circuits are well known in the electronic arts as logic circuits that operate according to a cycle of a clock signal. A first phase of the clock cycle (e.g., when the clock signal is low) may be a precharge (or pre-discharge) phase, whereas a second phase of the clock cycle is an evaluation phase. During the precharge phase of a circuit that utilizes the same, certain nodes of a dynamic circuit may be precharged to a logic high level. During the evaluation phase, the precharged nodes may either remain at a logic high level or be discharged to a low level, depending on a logical evaluation of the inputs. For a circuit that utilizes a pre-discharge instead of a precharge, the operation may be similar to that described above, although the logic/voltage levels may be reversed.

Many types of circuitry may be implemented using dynamic logic circuitry. Memory circuits within a processor (e.g., cache memories) are one such application that may utilize dynamic logic. Such memories may include storage cells, corresponding bit lines coupled to the storage cells, precharge circuits coupled to the bit lines, and corresponding input circuits coupled to the other end of the bit lines. Write operations may be conducted according to the normal operation of dynamic logic circuitry. During a precharge phase of a write cycle, the bit lines may be precharged to a logic high level. When the evaluation phase begins, a data value may cause the bit line to either discharge or retain its value, depending on the data it has received. The resulting state of the bit line may be written into the storage cell.

While the use of dynamic logic circuits may be useful in some situations, the precharging of bit lines may have certain drawbacks. Since all conductors have a certain amount of capacitance, precharging bit lines implemented using long wires may consume more power for both precharging and discharging. Furthermore, as the capacitance of a wire increases, the amount of time to precharge and discharge the wire also increases.

SUMMARY

A dynamic circuit utilizing a passgate on a bit line is disclosed. In one embodiment, a precharge circuit is coupled to a first bit line, while a discharge circuit is coupled to a second bit line. A passgate transistor is coupled between the first bit line and the second bit line such that the two bit lines are effectively coupled to each other. A gate terminal of the passgate transistor may be hardwired or otherwise held to a static voltage such that it remains active when the circuit is operating. During a precharge phase, the precharge circuit may precharge the first bit line to a voltage that is at or near a supply voltage of the circuit. The second bit line may be precharged, through the passgate transistor, responsive to the precharging of the first bit line. Furthermore, while the first bit line may be precharged to a voltage that is at or near the supply voltage, the second bit line may be precharged to a voltage that is at least a threshold voltage less than the supply voltage. During an evaluation phase, the discharge circuit may activate and thus discharge the second bit line responsive to a first condition. Responsive to a second condition, the discharge circuit may remain inactive, and thus the first and second bit lines may remain at the logical states to which they were precharged during the precharge phase.

In one embodiment, a method includes precharging a first bit line during a precharge phase of operation in a dynamic logic circuit (e.g., such as an on-chip memory circuit). The method further includes precharging a second bit line during the precharge phase. The second bit line is coupled to the first bit line by a passgate transistor that is held statically active. The circuit performing the precharge is coupled to the first bit line, and thus the precharge of the second bit line is performed via the transistor. While the first bit line is precharged directly by the precharge circuit, the second bit line is precharged indirectly, by was of the passgate transistor.

Precharging the second bit line indirectly, via the passgate transistor, may result in both power savings and a speed increase in some embodiments. Power savings may be realized since the second bit line need not be precharged to the supply voltage of the circuit. Since the second bit line is precharged to a voltage that is at least the threshold voltage below the supply voltage, the precharge operation may be performed faster since only the first bit line is fully precharged to a voltage substantially equal to the supply voltage. Furthermore, due to the lower precharge voltage, the second bit line may be discharged faster during the evaluation phase. This may be especially useful when the bit lines are long, and thus exhibit a non-negligible amount of capacitance. The precharge circuit may be coupled to a shorter, first bit line, while the longer, second bit line may be precharged by the precharge circuit through the passgate transistor.

BRIEF DESCRIPTION OF THE DRAWINGS

The following detailed description makes reference to the accompanying drawings, which are now briefly described.

Figure 1:
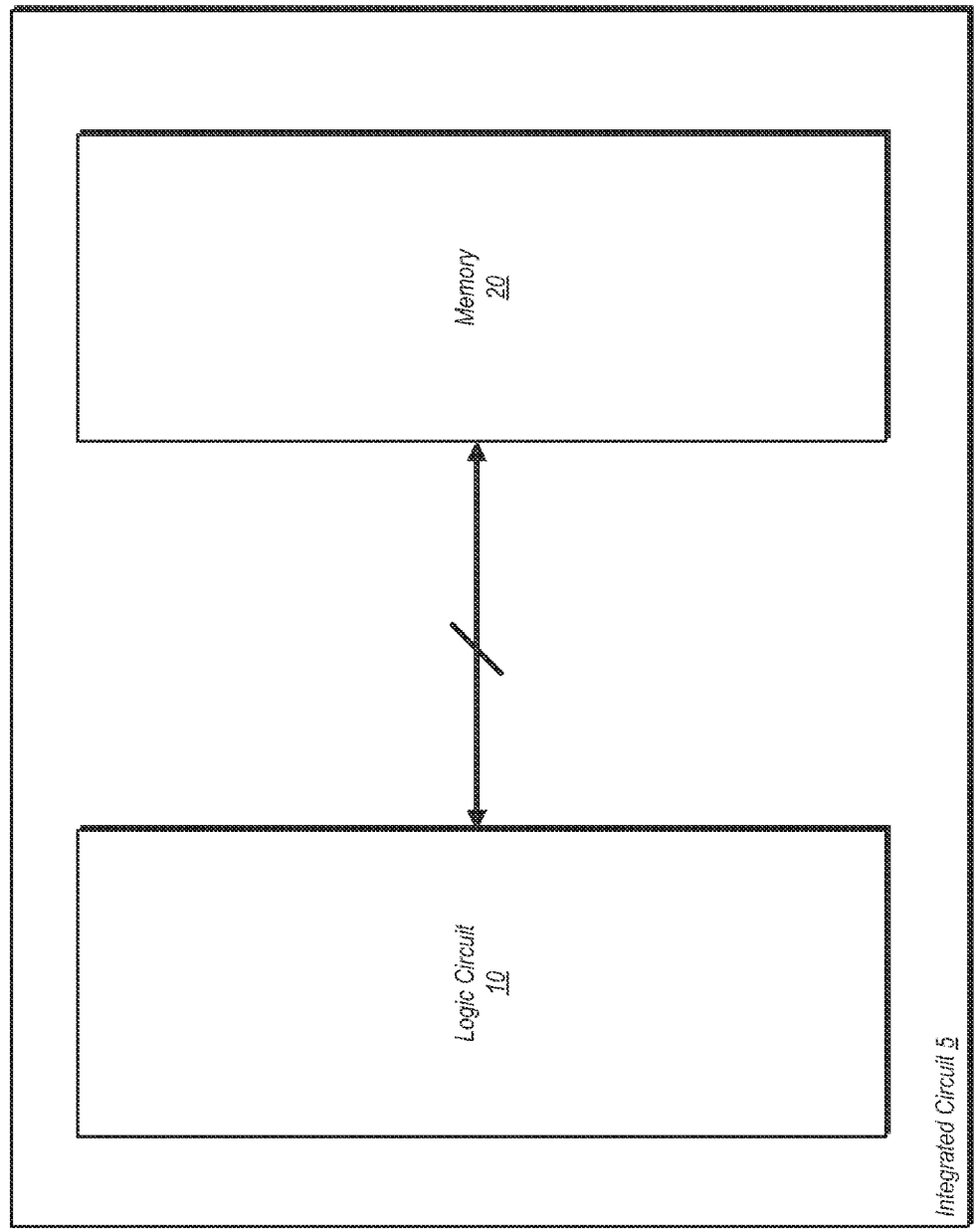
FIG. 1 is a block diagram illustrating one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit with on-Chip Memory:

Turning now to FIG. 1, a block diagram of an exemplary embodiment of an integrated circuit (IC) is shown. In the illustrated embodiment, IC 5 includes an logic circuit 10 coupled to a memory 20. Logic circuit 10 may be any type of circuitry that executes instructions or otherwise performs an intended logical function of IC 5. Memory 20 may store instructions and/or data that may be used by logic circuit 10 in carrying out its functions. Accordingly, logic circuit 10 may read information from and write information to memory 20 during operation of IC 5.

Figure 2:
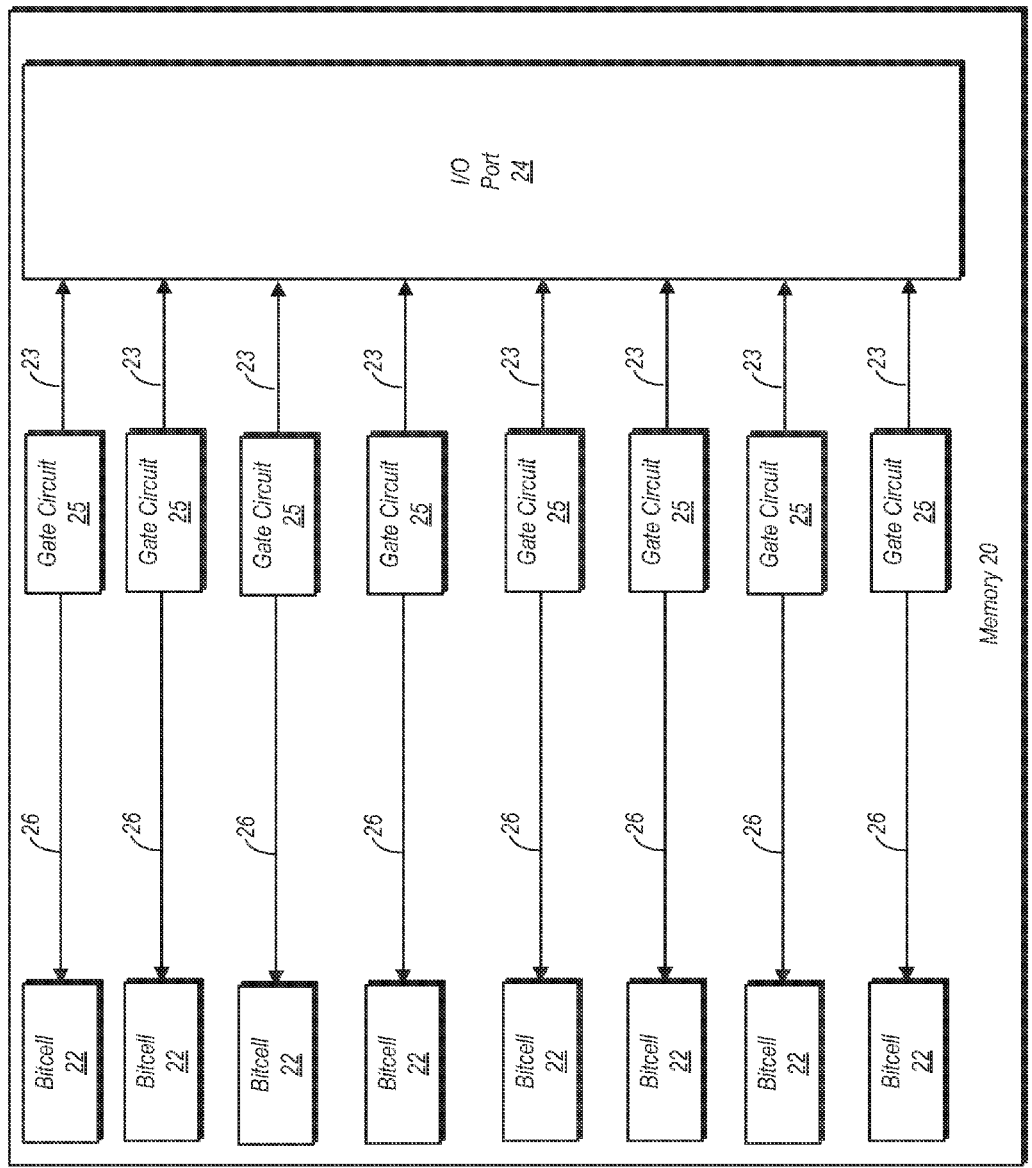
FIG. 2 is a block diagram illustrating one embodiment of a memory.

FIG. 2 is a block diagram of memory 20. In the exemplary embodiment shown, memory 20 includes a number of bitcells 22 and an I/O port 24. I/O port 24 may be a read port, write port, or may implement both of these. Moreover, I/O port may implement multiple instances of read and/or write ports.

Each bitcell 22 in the embodiment shown is coupled to I/O port through a corresponding pair of bit lines 23 and 26, and a gate circuit 25 coupled between these bit lines. Each bitcell 22 in the embodiment shown is coupled to a corresponding bit line 26, while each gate circuit 25 is coupled to I/O port 24 by a corresponding bit line 23. Each gate circuit 25 is also coupled between a bit line 23 and a bit line 26. Although not explicitly shown here, a precharge circuit may be coupled to one of each pair of bit lines. As will be explained in further detail below, the precharge circuit may precharge the bit line to which it is coupled during a precharge phase. The other bit line of the pair may be precharged indirectly, by way of gate circuit 25. In one embodiment, gate circuit 25 may be implemented as a single transistor passgate, while in another embodiment, gate circuit 25 may be implemented using a dual-transistor passgate. In some dual-passgate transistor embodiments, one of the transistors of the passgate may be held unconditionally inactive, while in others, both transistors of the passgate are active. In both single and dual-transistor passgate embodiments, at least one transistor may be held unconditionally active, as will be explained further below. It is noted that while implemented in the context of a memory as shown in FIG. 2, embodiments of gate circuit 25 may be implemented in other applications as well. In general, the various embodiment of a gate circuit discussed herein may be implemented in any type of dynamic circuitry.

Figure 3:
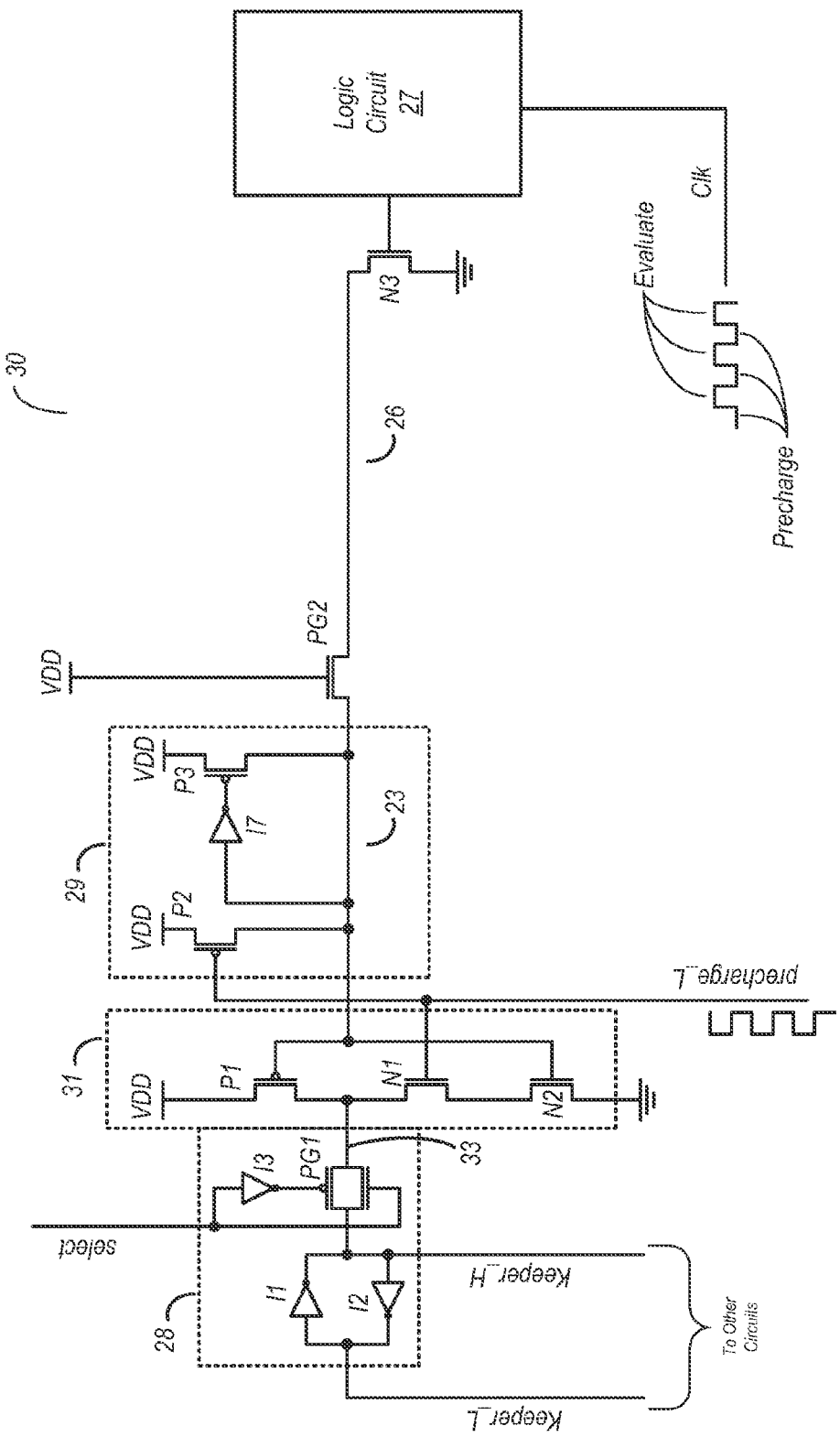
FIG. 3 is a schematic diagram of one embodiment of a circuit utilizing a statically active passgate.

Embodiments Circuits Utilizing Statically Active Passgates:

Turning now to FIG. 3, a schematic diagram of one embodiment of a circuit utilizing a statically active passgate is shown. For the purposes of this disclosure, it is noted that transistors designated with an 'N' are n-channel metal oxide semiconductor (NMOS) transistors. Transistors designated with a 'P' are p-channel metal oxide semiconductor (PMOS) transistors. Components designated with an "I" are inverters, while components designated with a 'G' may be a logic gate. Components designated with a 'PG' are passgates, which may be implemented with NMOS transistors, PMOS transistors, or both. It is noted that embodiments using other components than those shown in the various drawings here are possible and contemplated, and thus the disclosure is intended to cover such equivalents in addition to the embodiments expressly discussed herein.

Circuit 30 may be, in one embodiment, a circuit coupled between a bitcell 22 and an I/O port 24, in accordance with the embodiment of memory 20 shown in FIG. 2. Logic circuit 27 may thus be an equivalent to a bitcell 22 of memory 20. However, the circuit structure shown herein may be used in other applications as well. Logic circuit 27 may be any type of logic circuit that may be implemented as a dynamic logic circuit, or any type of memory structure that is used in reading data from and/or writing data to a memory. Logic circuit 27 in this embodiment is coupled to provide a signal to the gate terminal of transistor N3. Transistor N3 as implemented herein may function as a discharge circuit. More particularly, during an evaluation phase (which may occur when a clock signal is high in this embodiment), transistor N3 may become active if a first condition is present (e.g., a logic 1 voltage on its gate terminal), thereby providing a pull down path between bit line 26 and ground. Transistor N3 may remain inactive during the evaluation phase if a second condition is present (e.g., a logic 0 voltage on its gate terminal). During a precharge phase (which may occur when the clock signal is low in this embodiment), transistor N3 may be held inactive so as to not affect the state of bit line 26.

Bit line 26 is coupled to bit line 23 in this embodiment by PG2. In the embodiment shown, PG2 is implemented by a single NMOS transistor. Moreover, the NMOS transistor that implements PG2 is hardwired to supply voltage node VDD in this embodiment, and thus remains unconditionally active. In general, PG2 may be held inactive using any suitable connection to a static voltage that causes the NMOS transistor to remain active.

Circuit 30 also includes a precharge circuit 29 coupled to bit line 23. In this particular embodiment, precharge circuit 29 is implemented using transistor P2. Transistor P2 includes a gate terminal coupled to the signal line labeled precharge_L, upon which a clock signal may be conveyed. In some embodiments, a dedicated precharge signal may be conveyed on the precharge_L signal line in lieu of the clock signal. When the clock signal is low, transistor P2 may be activated, thereby providing a pull-up path between bit line 23 and VDD. The precharged voltage value on bit line 23 may be affected by various factors such as the drain-source resistances of transistor P2. However, the difference between the precharged voltage value of bit line 23 and the supply voltage received on VDD may be minimal.

Inverter 17 and transistor P3 may operate to form a keeper circuit in circuit 30. When bit line 23 is pulled high responsive to the activation of transistor P2, the output of inverter 17 (coupled to the gate of transistor P3) falls to a logic 0 voltage. This in turn may cause transistor P3 to be activated, thereby holding the precharged value of bit line 23 through at least the remainder of the precharge phase.

Figure 6:
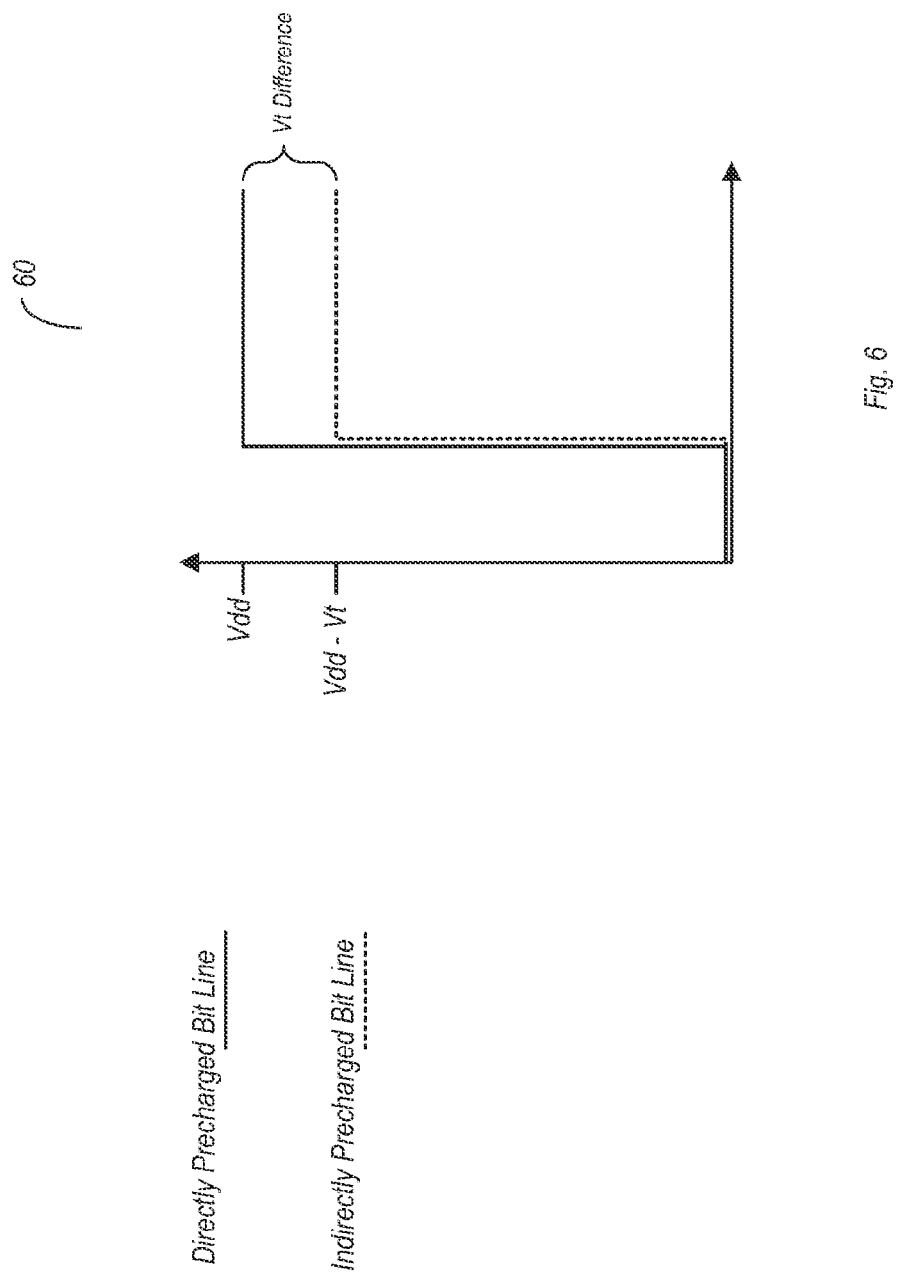
FIG. 6 is a graph illustrating relative voltage levels on first and second bit lines resulting from precharging in one embodiment of a circuit having a statically active passgate.

While bit line 23 may be precharged to a voltage that is substantially equal to the supply voltage received on VDD, bit line 26 may be precharged to a lower voltage level. In the embodiment shown, no precharged circuit is directly coupled to bit line 26. Instead, the precharge of bit line 23 may cause bit line 26 to also be precharged, via the NMOS transistor that implements PG2. Accordingly, while bit line 23 may be precharged to approximately the supply voltage, bit line 26 may be precharged to a voltage that is less than the supply voltage by approximately the threshold voltage of the transistor implementing PG2. This is illustrated in FIG. 6, which graphically illustrates the difference in the respective precharge voltages of bit line 23 and bit line 26.

Precharging bit line 26 indirectly and to a lower precharge voltage may result in power savings over an embodiment where this same bit line were to be precharged to the fully supply voltage. A speed increase may also be possible, since transistor N3 may be able to discharge the lesser voltage of bit line 26 faster than would otherwise be possible were it precharged to the supply voltage. The arrangement shown herein may be particularly useful in embodiments where bit line 26 is significantly longer than bit line 23, and thus has a greater amount of capacitance than the latter.

Bit line 23 in the embodiment shown is coupled to a keeper 28 via gated inverter 31. Gated inverter 31 includes transistors P1, N1, and N2. Gated inverter 31 may provide, on node 33, a complement of the logic value on node 23 when the clock signal is high (and thus, N1 is active). Otherwise, when N1 is inactive, gated inverter does not drive node 33. It is noted that gated inverter 31 is optional, and embodiments of circuit 30 including other types of circuit coupled to receive a logic value from node 23 are possible and contemplated.

In this particular embodiment, circuit 30 includes a keeper circuit 28. Keeper circuit 28 includes cross-coupled inverters I1 and I2, which may form a storage cell for a memory, while in another embodiment keeper circuit 28 may be a keeper in a read path of a memory. In general, keeper circuit 28 may provide the function of retaining the logic value conveyed on bit lines 23 and 26 during the evaluation phase.

Keeper circuit 28 also includes passgate PG1 in this embodiment, although this passgate is optional and need not be implemented in all embodiments. Passgate PG1 includes both PMOS and NMOS transistors which may be activated at the same time. In the embodiment shown, assertion of the select signal as a logic 1 voltage may cause the activation of the transistors of passgate PG1. Since the transistors are of opposite polarity, an inverter I3 is used in this embodiment to provide a logic 0 voltage to the gate of the PMOS transistor of PG1.

Figure 4:
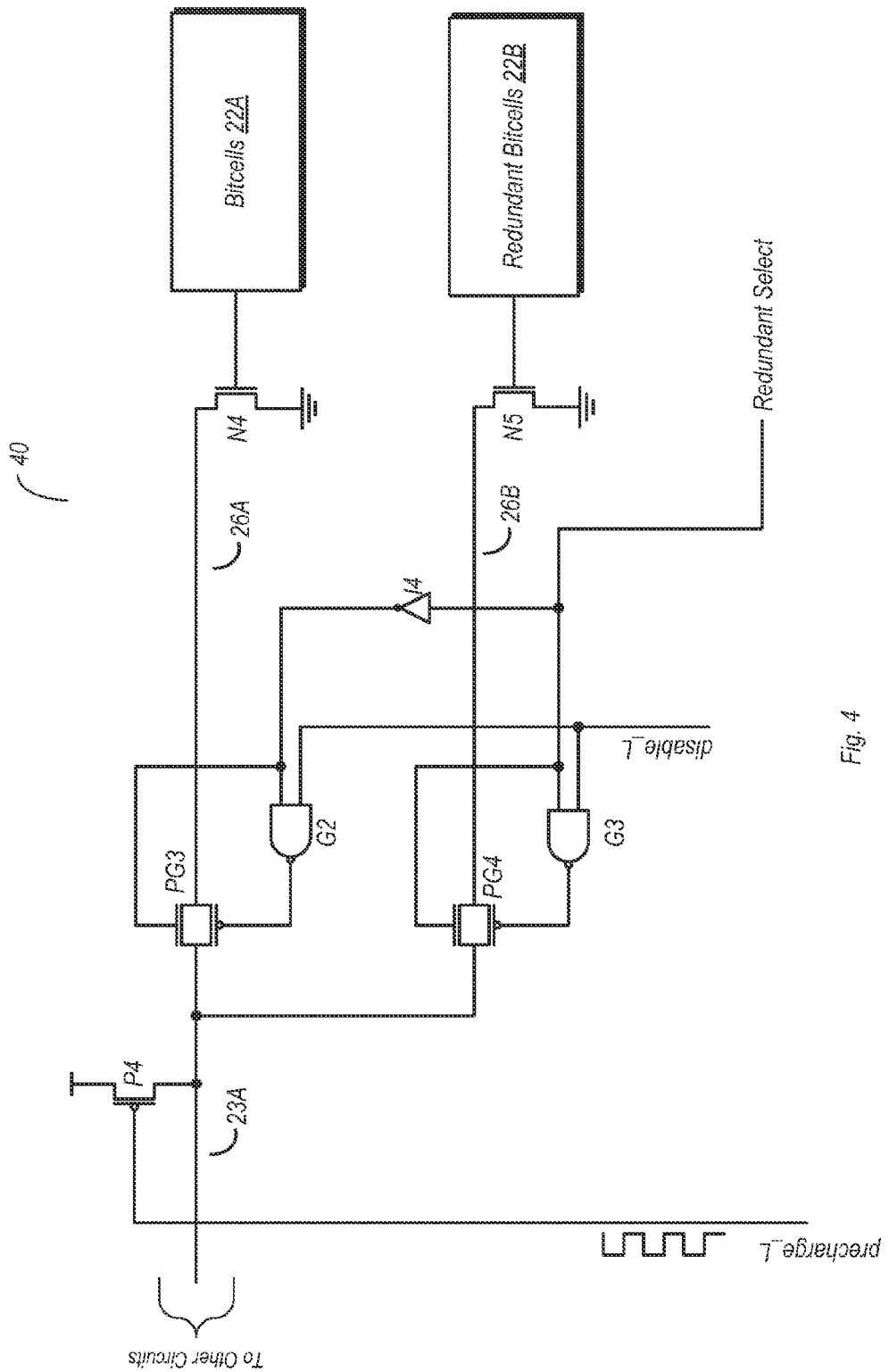
FIG. 4 is a schematic diagram of another embodiment of a circuit utilizing a statically active passgate.

FIG. 4 is a schematic diagram of another embodiment of a circuit utilizing a statically active passgate. Circuit 40 in the embodiment shown may be utilized in a redundant memory structure, and thus includes one or more bitcells 22A and one or more redundant bitcells 22B, which are coupled to transistors N4 and N5, respectively. Transistors N4 and N5 may serve as both sense amplifiers as well as discharge circuits that discharge their respectively coupled bit lines depending on the data received on their respective gate terminals. During operation of circuit 40, one of N4 or N5 may receive data from an operatively coupled bitcell, depending on whether or not redundant cells are selected to provide data. When a normal cell is selected, transistor N4 may discharge bit line 26A during an evaluation phase if that bitcell is storing a logic 1 on a node coupled to the gate terminal of N4. If the bitcell having a node coupled to the gate terminal of N4 is storing a logic 0, N4 is held inactive and the logic 1 voltage to which bit line 26A was precharged remains. Transistor N5 may operate similarly with respect to bit line 26B.

During operation of circuit 40, bit line 23A may convey data from and operatively coupled one of bitcells 22A or redundant bitcells 22B to other circuitry. In the embodiment shown, passgates PG3 and PG4 are coupled to bit line 23A in a wired-OR configuration. When the disable_L signal is low, the respective outputs of NAND gates G2 and G3 are both high, and thus the PMOS transistors of PG3 and PG4 remain inactive. If the redundant select line is a logic 0 voltage, inverter I4 outputs a logic 1 voltage, thereby causing activation of the NMOS transistor of PG3, while the NMOS transistor of PG4 remains inactive. Thus, during an evaluation phase when the redundant select line is a logic low, data may be conveyed over bit lines 23A and 26A from bitcells 22A, while PG4 blocks data from being conveyed from bit line 26A to bit line 23A. When the redundant select line receives a logic 1 voltage, the NMOS transistor of PG4 may be activated, while the NMOS transistor of PG3 may be inactive. Thus, data may be conveyed on bit lines 26B and 23A during an evaluation phase when the redundant select line is receiving a logic 1 voltage.

Circuit 40 in the embodiment shown may be operated in a normal mode or a safe mode, depending on the state of the disable_L signal. When the disable_L signal line receives a logic 0 voltage, circuit 40 may operate in the normal mode. When the disable_L signal line receives a logic high voltage, circuit 40 may operate in the safe mode. The normal mode may be defined as operation wherein only one transistor of one of the passgates is active while its complementary transistor is inactive (e.g., only the NMOS of a passgate is active while the PMOS of the same passgate is inactive). Operation in the safe mode may be defined as operation wherein both the NMOS and PMOS transistors of a passgate are active. In both the normal and safe mode, the other passgate may have both of its transistors held to an inactive state.

When the disable_L signal receives a logic 1 voltage, both NAND gates G2 and G3 will receive a logic 1 voltage on one of their respective inputs. When the redundant select signal is low, inverter I4 may output a logic 1 voltage to the other input of NAND gate G2, causing it to output a logic low to the PMOS transistor of PG3. The logic 1 voltage output by inverter I4 will also cause the activation of the NMOS transistor of PG3. Thus, when P4 becomes active on the precharge cycle, the precharging of bit line 23A also causes the precharging of bit line 26A through both the NMOS and PMOS transistors of PG3. The low on the redundant select signal causes the NMOS transistor of PG3 to be held inactive, and also results in a high output from NAND gate G2, thereby causing the PMOS transistor of PG4 to also be held inactive.

When the redundant select line receives a logic 1 voltage concurrent with disable_L receiving a logic 1 voltage, NAND gate G3 outputs a logic 0 voltage, thereby causing activation of the PMOS transistor of PG4. The logic 1 voltage on the redundant select line also causes activation of the NMOS transistor of PG4. Thus, when transistor P4 precharges bit line 23A, bit line 26B is precharged through the NMOS and PMOS transistors of PG4. The logic 1 voltage on the redundant select line also causes inverter I4 to output a logic 0 voltage, which thus results in both the NMOS and PMOS transistors of PG3 being held inactive.

The safe mode may be useful in various situations. For example, if erroneous operation of the integrated circuit 5 is detected, the safe mode may be activated to determine if the indirect precharge is a contributor to the erroneous operation. For example, the lower indirect precharge voltage may be causing erroneous operation and/or a particular passgate may not provide enough current to adequately precharge a bit line indirectly. In some embodiments, operation in the normal or safe mode may be selectable by other circuitry during operation of circuit 40. In other embodiments, the disable_L signal line may be hardwired to a particular logic value subsequent to testing of an IC in which circuit 40 is implemented, e.g., by blowing a fuse or other mechanism.

Figure 5:
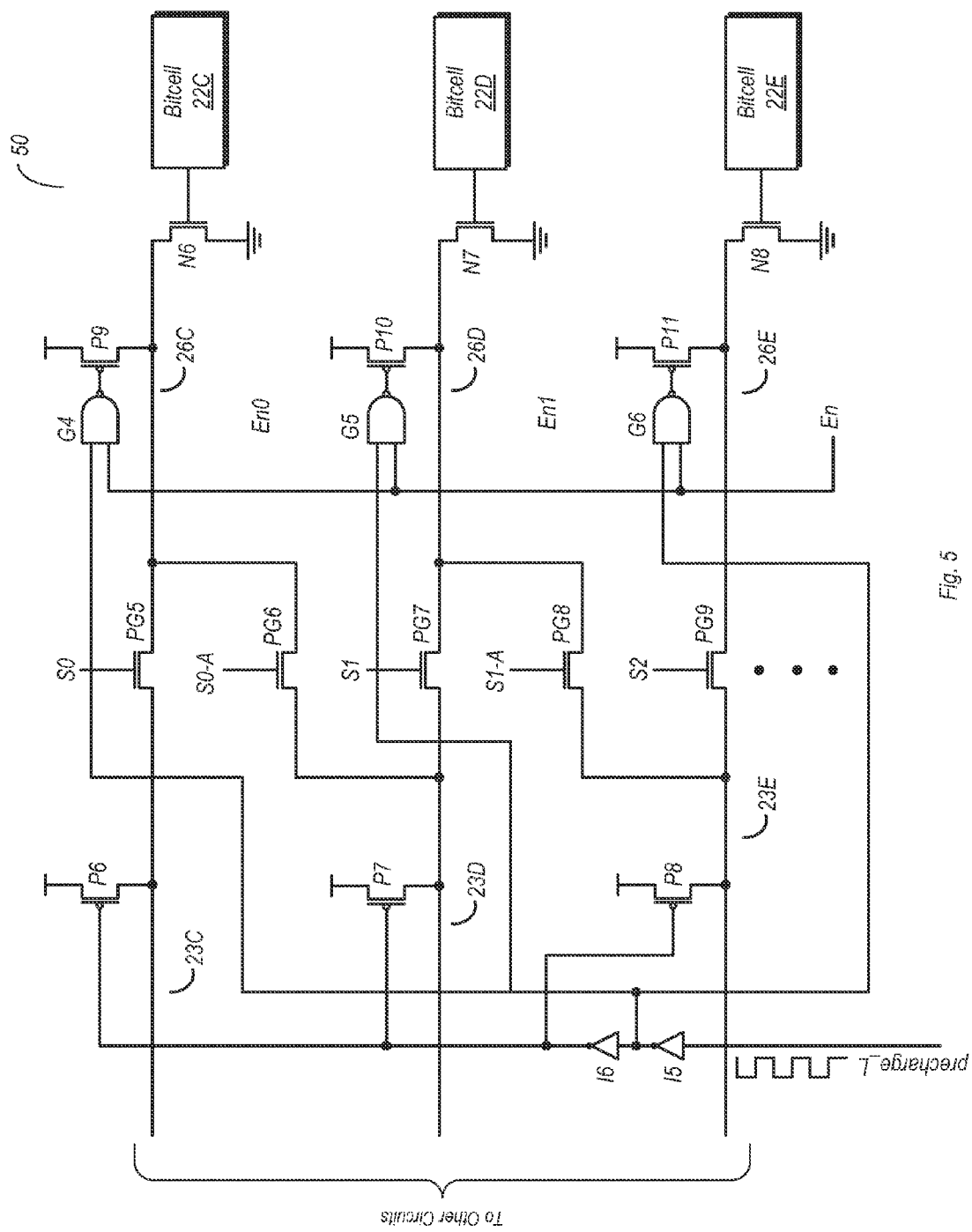
FIG. 5 is a schematic diagram of another embodiment of a circuit utilizing a statically active passgate.

FIG. 5 illustrates another circuit structure in which hardwired passgates may be used in a memory circuit structure configured to the substitution of redundant memory cells. In the embodiment shown, circuit 50 is shown with three bitcells 22 and corresponding circuitry, although the number of bitcells in such a structure may be significantly greater. Transistors N6, N7, and N8 operate as sense amplifiers/discharge circuits for their respectively coupled bit lines in the same manner as described above for the other embodiments. Similarly, transistors P6, P7, and P8 (each of which has a gate terminal coupled to the output of inverter I6) may operate as precharge circuits in the same manner as described above for their respectively coupled bit lines.

In the embodiment shown, circuit 50 includes passgates PG5-PG9, which may provide multiple paths through which a bit of data from a respective one of bitcells 22 may be provided to other circuitry. Each bitcell 22 may cause data to be conveyed through one of two passgates, only one of which may be active at a given time. Furthermore, both passgates coupled to a given bitcell 22 may be held inactive if it is discovered that the bitcell is faulty. In such a case, another bitcell may be substituted for the faulty bitcell 22 if possible. For example, if S0 is at a logic 1 voltage, S0-A may be held at a logic 0 voltage, and thus PG5 is active while PG6 is inactive. Accordingly, bitcell 22C may, during an evaluation phase, cause data to be conveyed from bit line 26C to bit line 23C via PG5. If bitcell 22C is to be a substitute for data stored in bitcell 22D (e.g., if bitcell 22D is inoperative), PG5 and PG7 may be held inactive while PG6 may be activated, and thus data from bit line 26C may be conveyed to bit line 23D during an evaluation phase. Similar operation may enable bitcells 22E or bitcell 22D to cause data to be provided on to bit line 23E, via either PG8 or PG9.

In general, a one-hot structure may be provided where for any two consecutive passgates, as illustrated in FIG. 5, only one is active at a given time. Thus, only one of PG5 and PG6 is active at a given time, only one of PG6 and PG7, only one of PG7 and PG8, and only one of PG8 and PG9. This may be accomplished by setting the states for the select signals (e.g., S0-S2, S0-A, S1-A) provided to the gate terminals of the NMOS transistors that implement these passgates. The states of these signals may be selectable during operation, or may be set during testing based on received results by subsequently blowing fuses or utilizing other mechanisms. The selected ones of these passgates may remain statically active (i.e. held in an active state) during operation.

Circuit 50 in the embodiment shown is configured to multiple mode operation. More particularly, each of bit lines 26C-26E in the embodiment shown have a discharge circuit coupled directly thereto. NAND gate G4 and transistor P9 may operate to precharge bit line 26C, NAND gate G5 and transistor P10 may operate to precharge bit line 26D, and NAND gate G6 and transistor P11 may operate to precharge bit line 26E. The precharge of any of the bit lines 26C-E may depend on a corresponding enable signal received by the respective NAND gate. If the enable signal (e.g., En) is deasserted, or a logic 0 voltage in this embodiment, no precharge of the corresponding bit line occurs during the precharge cycle. If the enable signal provided to NAND gates G4-G6 is asserted as a logic 1 voltage, then the logic 1 voltage received from the output of inverter I5 during the precharge cycle may thus cause its corresponding PMOS transistor to be activated. When a transistors P9-P11 are active, their corresponding bit lines may be precharged.

These auxiliary precharge circuits of circuit 50 may be disabled when operating in a normal mode, but may be enabled when operating in a safe mode. When operating in the normal mode, a precharge of any one of bit lines 26C-26E may be performed through a corresponding active passgate coupled thereto. For example, in the normal mode, bit line 26C may be precharged through either PG5 or PG6, depending on which one is active. When operating in the safe mode, bit line 26C may be precharged when P9 is activated, regardless of which one of passgates PG5 and PG6 is active. Selecting of the normal or safe modes may be accomplished in the same manner for circuit 50 as described above for circuit 40.

Figure 7:
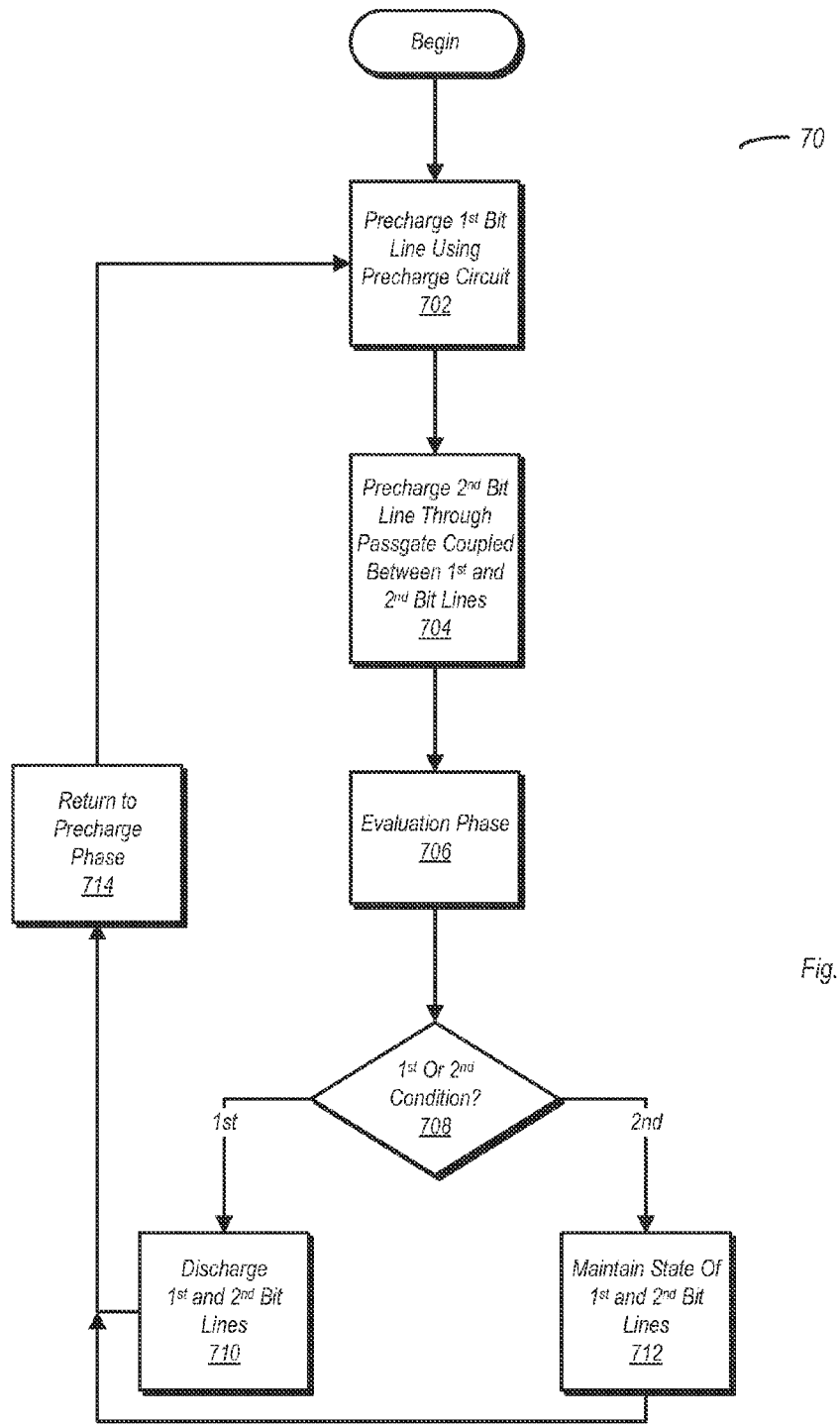
FIG. 7 is a flow diagram illustrating one embodiment of a method for operating a circuit having two bit lines coupled together by a statically active passgate transistor.

Method for Operating Circuits Having a Statically Active Passgate:

FIG. 7 is a flow diagram illustrating one embodiment of a method for operating a circuit having two bit lines coupled by a statically active passgate transistor. While the method to be described in reference to FIG. 7 includes certain operations, it is noted other operations may be included in the method. Accordingly, various embodiments of the method described with reference to FIG. 7 may incorporate additional details of circuit operation as described above in reference to FIG. 3-6.

Method 700 begins with the precharging of first bit line using a precharge circuit (block 702). The precharge circuit may be directly coupled to the first bit line, and may thus precharge it to a voltage level that is substantially equal to the supply voltage provided to the precharge circuit. As a result of a precharge of the first bit line, a second bit line may be precharged through a passgate transistor that is coupled to the first bit line (block 704). Thus, while the first bit line is precharged directly, the second bit line is indirectly precharged. Moreover, the voltage to which the second bit line is precharged may be less than that of the first bit line by a voltage that is approximately equal to the threshold voltage of the passgate transistor. The precharge operations may occur during a precharge phase (e.g., when a clock signal is low). The passgate transistor may receive a fixed voltage on its gate terminal, and thus may be held in an active state during operation, i.e. during both precharge and evaluation phases.

Subsequent to the precharge phase, and evaluation phase begins (block 706) when the clock signal transitions from a first state to a second state (e.g., from low to high). During the evaluation phase, the presence of either a first condition or a second condition may be determined (block 708). The first or second condition may be, in one embodiment, a logic voltage value that may appear on a gate terminal of a discharge transistor as a result of a logic function. In another embodiment, the discharge transistor may act as a sense amplifier, with the first or second condition being a value of a bit stored in a storage cell. If the first condition is present, the first and second bit lines may be discharged (block 710). In one embodiment, the discharge transistor may be directly coupled to the second bit line, although the first bit line may also be directly coupled to circuitry that provides a discharge path. However, it is also possible and contemplated that the discharge may also be performed via a passgate transistor in a manner analogous to the precharge. In either case, the second bit line may be directly discharge through the discharge transistor coupled thereto.

If the second condition is present, the first and second bit lines may be maintained at the state to which they were precharged (block 712), e.g., at a logic 1 voltage. Regardless of which condition was detected, the evaluation phase may end when the clock signal transitions back to its previous level (e.g., from high back to low), and thus the method returns to the precharge phase (block 714). Once in the precharge phase, the method may return to block 702.

It is noted that while the description of method 700 and the circuits of FIGS. 3-5 has been presented in reference to performing precharge operations, it is noted that embodiments wherein pre-discharge operations are performed instead are also possible and contemplated. In general, circuits that are configured to perform pre-discharge operations that otherwise conform to the principles of operation of changing the state of a one bit line by pulling the other bit line toward a certain voltage through a passgate may be considered equivalents to the circuits described herein.

Figure 8:
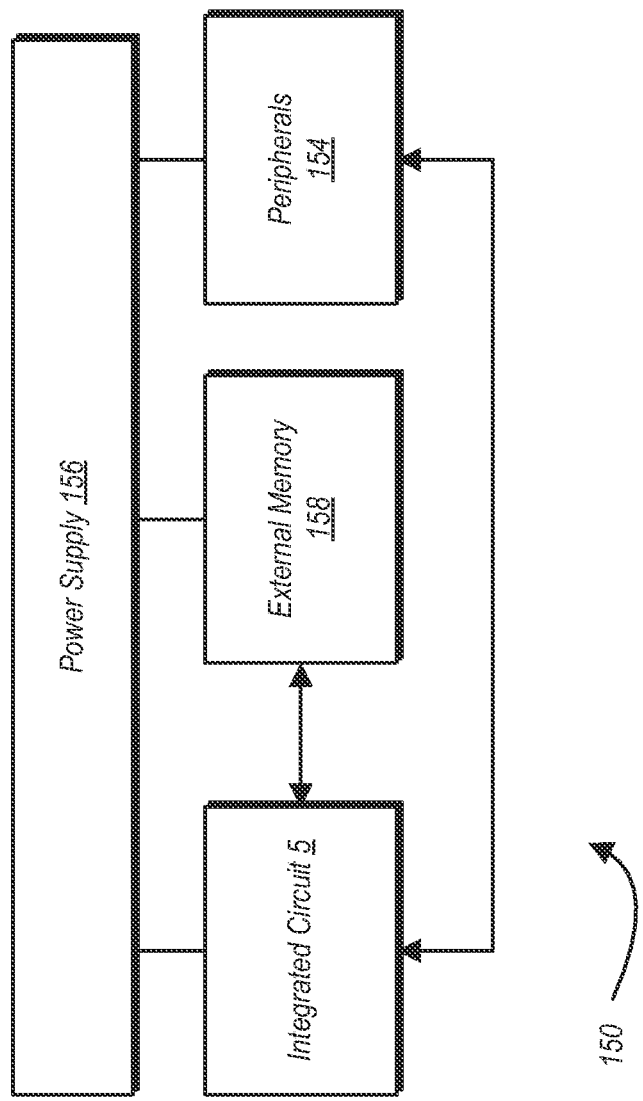
FIG. 8 is a block diagram of one embodiment of an exemplary system.

Exemplary System:

Turning next to FIG. 8, a block diagram of one embodiment of a system 150 is shown. In the illustrated embodiment, the system 150 includes at least one instance of an IC 5 (from FIG. 1) coupled to one or more peripherals 154 and an external memory 158. A power supply 156 is also provided which supplies the supply voltages to the IC 5 as well as one or more supply voltages to the memory 158 and/or the peripherals 154. In some embodiments, more than one instance of the IC 5 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
   a first bit line;
   a precharge circuit coupled to the first bit line;
   a second bit line; and
   a transistor coupled between the first bit line and the second bit line, wherein the transistor includes a gate terminal coupled to a first static voltage such that the transistor remains active during operation;
   wherein the precharge circuit is configured to, during a first phase of a clock signal, precharge the first bit line to a voltage substantially equal to a supply voltage provided to the precharge circuit, and further configured to precharge the second bit line, through the transistor, to a voltage that is less than the supply voltage by at least a threshold voltage of the transistor.

2. The circuit as recited in claim 1, wherein the circuit further includes a logic circuit coupled to the second bit line, wherein the logic circuit is configured to, during a second phase of the clock signal, cause the second bit line to be discharged responsive to at least a first condition and further configured to not cause the second bit line to be discharged responsive to at least a second condition different from the first.

3. The circuit as recited in claim 2, wherein the logic circuit is further configured to cause the first bit line to be discharged via the transistor responsive to at least the first condition.

4. The circuit as recited in claim 1, wherein the circuit further includes a storage cell coupled to the first bit line, wherein the storage cell is configured to store a logic value based on a state of the first bit line during a second phase of the clock signal.

5. The circuit as recited in claim 1, wherein the circuit further includes a storage cell coupled to the second bit line, wherein the storage cell is configured to convey a stored logic value to the first bit line via the second bit line and the transistor during a second phase of the clock cycle.

6. A method comprising:
   precharging a first bit line, wherein said precharging the first bit line is performed by a precharge circuit coupled directly to the first bit line, wherein said precharging the first bit line includes pulling a voltage on the first bit line to a level approximately equal to a supply voltage provided to the precharge circuit; and
   precharging a second bit line responsive to precharging the first bit line, wherein said precharging the second bit line is performed through a transistor coupled between the first bit line and the second bit line, wherein said precharging the second bit line includes precharging the second bit line to a voltage that is less than the supply voltage by at least a threshold voltage of the transistor.

7. The method as recited in claim 6 further comprising:
   precharging the first bit line and precharging the second bit line during a first phase of a clock signal; and
   a logic circuit performing a logical evaluation responsive to one or more logic inputs during a second phase of the clock signal;
   discharging the second bit line during the second phase of the clock signal responsive to the logical evaluation if the one or more logic inputs indicate a first condition; and
   maintaining the second bit line, during the second phase of the clock signal, at a state equivalent to a state attained by performing said precharging responsive to the logical evaluation if the one or more logic inputs indicate a second condition.

8. The method as recited in claim 7, further comprising discharging the first bit line through the transistor responsive to discharging the second bit line.

9. The method as recited in claim 6, further comprising providing a first fixed voltage to a gate terminal of the transistor and maintaining the transistor in an active state responsive to the first fixed voltage.

10. The method as recited in claim 9, further comprising a sense amplifier discharging the second bit line if a storage cell is storing a first logic value, and maintaining the second bit line at a current voltage level if the storage cell is storing a second logic value, wherein said precharging is performed during a first phase of a clock signal and wherein one of said discharging and said maintaining are performed during a second phase of the clock signal.

11. A circuit for a memory array, the circuit comprising:
   a discharge circuit;

a first bit line coupled to the discharge circuit, wherein the discharge circuit is configured to, during an evaluation phase, discharge the first bit line responsive to a first condition;

a first passgate transistor having a first terminal coupled to the first bit line and a gate terminal coupled to a static voltage, wherein the first passgate transistor is configured to remain active during operation responsive to the static voltage; and a precharge circuit coupled to a second terminal of the first passgate transistor, wherein the precharge circuit is configured to, during a precharge phase, precharge the first bit line via the first passgate transistor.

12. The circuit as recited in claim 11, wherein the precharge circuit is configured to precharge a second bit line to a first voltage level that substantially equal to an operating voltage of the precharge circuit, and wherein the precharge circuit is further configured to, via the first passgate transistor, precharge the first bit line to a voltage level that is less than the operating voltage by at least a threshold voltage of the first passgate transistor.

13. The circuit as recited in claim 12, wherein the precharge circuit is coupled to a second bit line and to a supply voltage node, wherein the precharge circuit is configured to precharge the second bit line to a voltage substantially equal to a supply voltage on the supply voltage node.

14. The circuit as recited in 13, wherein the circuit further includes a storage element coupled to the discharge circuit, wherein the first condition includes the storage element storing a first logic value, and wherein the discharge circuit is further configured to enable a state of the first bit line to be maintained if the storage element is storing a second logic value.

15. The circuit as recited in claim 12, wherein the circuit further includes a second passgate transistor coupled between the first bit line and the second bit line, wherein a gate terminal of the second passgate transistor is held active when operating in a first mode, an wherein the second passgate transistor is held inactive when operating in a second mode.

16. A memory circuit comprising:
a plurality of first bit lines;
a plurality of precharge circuits, wherein each of the plurality of precharge circuits is coupled to a corresponding one of the plurality of first bit lines;

a plurality of gate transistors, wherein each of the wherein each of the plurality of gate circuits is coupled to a corresponding one of the plurality of first bit lines, and wherein a gate terminal of each of the plurality of gate transistors is coupled to a first fixed voltage such that each of the plurality of gate transistors remain active during operation; and a plurality of second bit lines coupled to each of the plurality of gate transistors;

wherein each of the plurality of precharge circuits is configured to precharge its corresponding first bit line to a supply voltage during a first portion of a clock phase and further configured to cause its corresponding second bit line to be precharged to a voltage that is less than the supply voltage by at least a threshold voltage of the corresponding gate transistor.

17. The memory circuit as recited in claim 16, wherein the memory circuit further includes a plurality of discharge circuits each coupled to a corresponding one of the plurality of second bit lines.

18. The memory circuit as recited in claim 17, wherein the memory circuit further includes a plurality of storage cells each coupled to a corresponding one of the plurality of first bit lines, wherein each of the plurality of discharge circuits is coupled to receive data to be written to a corresponding one of a plurality of storage cells during a write operation occurring during a second phase of the clock signal, wherein a given one of the plurality of discharge circuits is configured to discharge its corresponding second bit line if a first logic value is to be written to its corresponding storage cell, and wherein the given one of the plurality of discharge circuits is not configured to discharge its corresponding second bit line if a second value is to be written to its corresponding storage cell.

19. The memory circuit as recited in claim 17, wherein the memory circuit further includes a plurality of storage cells each coupled to a corresponding one of the plurality of discharge circuits, wherein during a read operation occurring during a second phase of the clock signal, a given one of the discharge circuits is configured to discharge its corresponding second bit line if the storage cell is storing a first logic value, and further configured to inhibit the second bit line from being discharged if the storage cell is storing a second logic value.

* * * * *